(12) United States Patent
Geen et al.

(10) Patent No.: US 7,017,411 B2
(45) Date of Patent: Mar. 28, 2006

(54) APPARATUS WITH SELECTED FILL GAS

(75) Inventors: John A. Geen, Tewksbury, MA (US); John Martin, Foxborough, MA (US)

(73) Assignee: Analog Devices, Inc., Norwood, MA (US)

( * ) Notice: Subject to any disclaimer, the term of this patent is extended or adjusted under 35 U.S.C. 154(b) by 63 days.

(21) Appl. No.: 10/793,382

(22) Filed: Mar. 4, 2004

(65) Prior Publication Data

US 2005/0193814 A1    Sep. 8, 2005

(51) Int. Cl.
*G01P 15/02* (2006.01)

(52) U.S. Cl. ............... 73/514.13; 73/504.02; 73/430

(58) Field of Classification Search ............ 73/514.13, 73/504.02, 504.08, 504.12, 514.07, 430; 200/61.45 R
See application file for complete search history.

(56) References Cited

U.S. PATENT DOCUMENTS

| | | | |
|---|---|---|---|
| 3,342,074 A * | 9/1967 | Stedman ............... 73/514.13 |
| 4,320,669 A * | 3/1982 | Grohe ................... 73/504.08 |
| 4,644,803 A * | 2/1987 | Ward .................... 73/514.07 |
| 5,068,502 A * | 11/1991 | Davenport ......... 200/61.45 M |
| 5,939,633 A | 8/1999 | Judy |
| 6,323,550 B1 | 11/2001 | Martin et al. ............ 257/704 |
| 6,465,280 B1 | 10/2002 | Martin et al. ............ 438/125 |
| 6,505,511 B1 | 1/2003 | Geen et al. |
| 6,510,745 B1 | 1/2003 | Geen |
| 6,516,651 B1 | 2/2003 | Geen |
| 6,621,158 B1 | 9/2003 | Martin et al. ............ 257/704 |
| 2003/0075794 A1 | 4/2003 | Felton .................... 257/707 |

* cited by examiner

*Primary Examiner*—John E. Chapman
(74) *Attorney, Agent, or Firm*—Bromberg & Sunstein LLP

(57) ABSTRACT

An inertial sensor has an interior filled with a relatively low viscosity fill gas. To that end, the inertial sensor has a housing forming the noted interior, and a movable component within the interior. The inertial sensor also has the noted fill gas within the interior. The fill gas has a viscosity that is less than the viscosity of nitrogen under like conditions. For example, when subjected to the same temperatures and pressures, the fill gas has a viscosity that is less than the viscosity of nitrogen.

17 Claims, 3 Drawing Sheets

APPARATUS WITH SELECTED FILL GAS

FIELD OF THE INVENTION

The invention generally relates to integrated circuit devices and, more particularly, the invention relates to fill gasses used by integrated circuit devices.

BACKGROUND OF THE INVENTION

Currently available microelectromechanical systems ("MEMS") typically are produced from very thin films (e.g., on the order of four micrometers thick). Such thin films have the undesirable quality of being relatively fragile, even when made from relatively strong materials, such as silicon. Accordingly, without some means for protecting the internal MEMS structure, MEMS devices would not be very robust for many applications. For example, without some means for protecting its basic structure, the flexures supporting a movable mass of a MEMS accelerometer may crack when subjected to anticipated accelerations.

The art has responded to this problem by filling the interior cavities of MEMS devices with relatively high viscosity gasses. More specifically, high viscosity gasses maintain MEMS structural integrity by effectively cushioning movable components of a MEMS device. A high viscosity gas within an accelerometer therefore should cushion the movable mass and its flexures when subjected to anticipated accelerations. Accordingly, this cushioning effect should maintain the internal MEMS components in operable condition. Exemplary gasses used for these purposes include nitrogen, which has a viscosity of about 17.6 micropascal-seconds at 20 degrees C., and ambient air, which has a viscosity of about 18.2 micropascal-seconds at about 20 degrees C.

In addition to providing a cushioning effect, however, high viscosity gasses in MEMS devices frequently generate noise (referred to in the art as "Brownian Noise"). In fact, such noise often can impede the basic function of the MEMS device.

SUMMARY OF THE INVENTION

In accordance with one aspect of the invention, an inertial sensor has an interior filled with a relatively low viscosity fill gas. To that end, the inertial sensor has a housing forming the noted interior, and a movable component within the interior. The inertial sensor also has the noted fill gas within the interior. The fill gas has a viscosity that is less than the viscosity of nitrogen under like conditions. For example, when subjected to the same temperatures and pressures, the fill gas has a viscosity that is less than the viscosity of nitrogen.

The fill gas may include a fluorocarbon, and/or may include at least one of Freon 22, methane, ammonia, ethane, hydrogen, butane, and propane. In some embodiments, the fill gas has a viscosity that is no less than the viscosity of propane under like conditions. Moreover, the movable component may be a part of a MEMS device and/or may be a part of an accelerometer or a gyroscope. As an example, the housing may include a capped package, where the cap hermetically seals the package. Illustrative embodiments maintain the interior at a substantially non-zero pressure.

In accordance with another aspect of the invention, an apparatus has a package forming an interior with a substantially non-zero pressure, and a device within the interior. The apparatus also has a fill gas (within the interior) with a viscosity that is less than 17.6 micropascal-seconds at about 20 degrees C.

In some embodiments, the fill gas has a viscosity of between about 7 and 17 micropascal-seconds at about 20 degrees C. In yet other embodiments, the device has a noise performance that is no greater than about 0.02 degrees per square root of a second.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In accordance with illustrative embodiments of the invention, an inertial sensor has a fill gas with a viscosity that is both low enough to minimize noise, and yet high enough to provide its underlying cushioning function to movable silicon components. Some gasses having viscosities lower than nitrogen should provide satisfactory results. For example, propane and ethane should suffice. Various embodiments are discussed in greater detail below.

Figure 1:
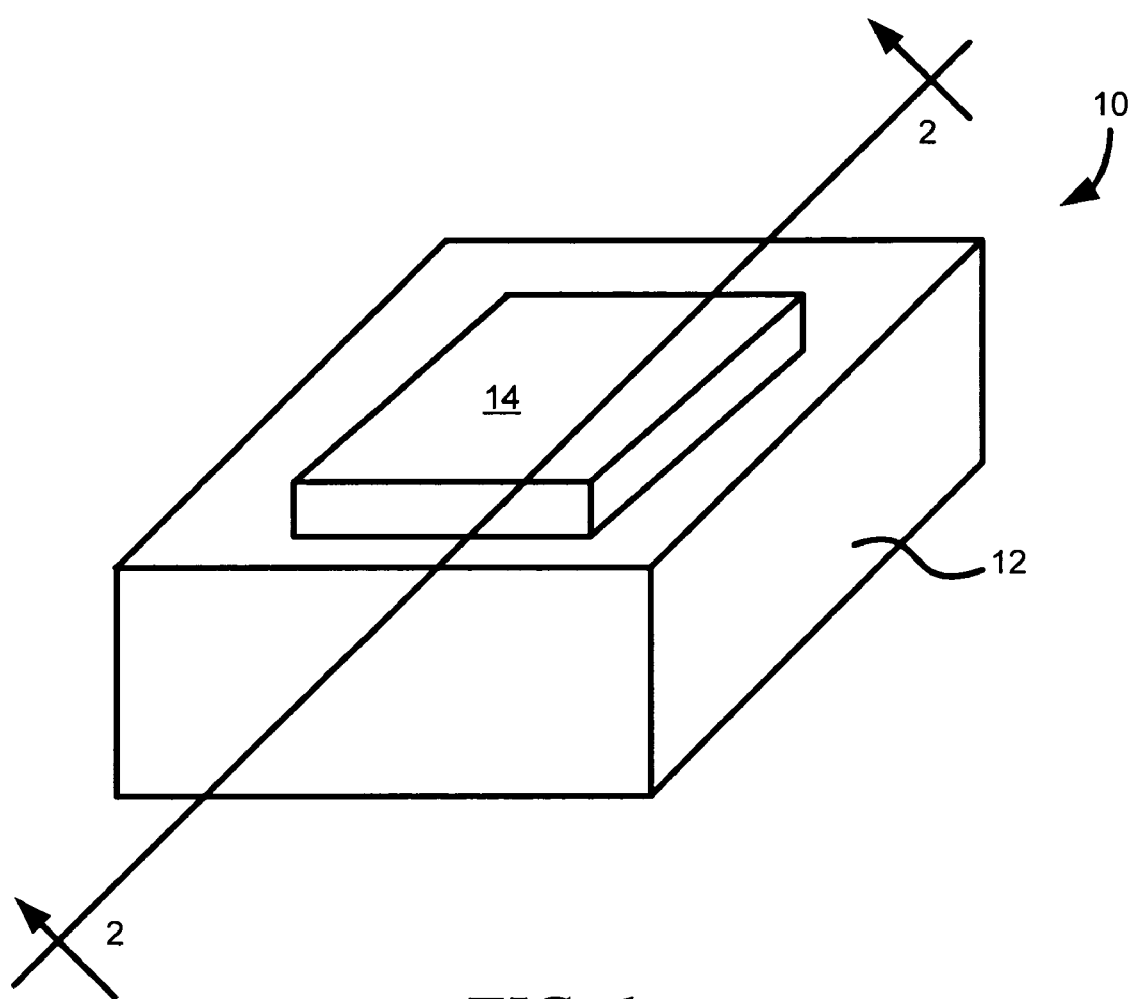
FIG. 1 schematically shows a sensor that may implement illustrative embodiments of the invention.
Figure 2:
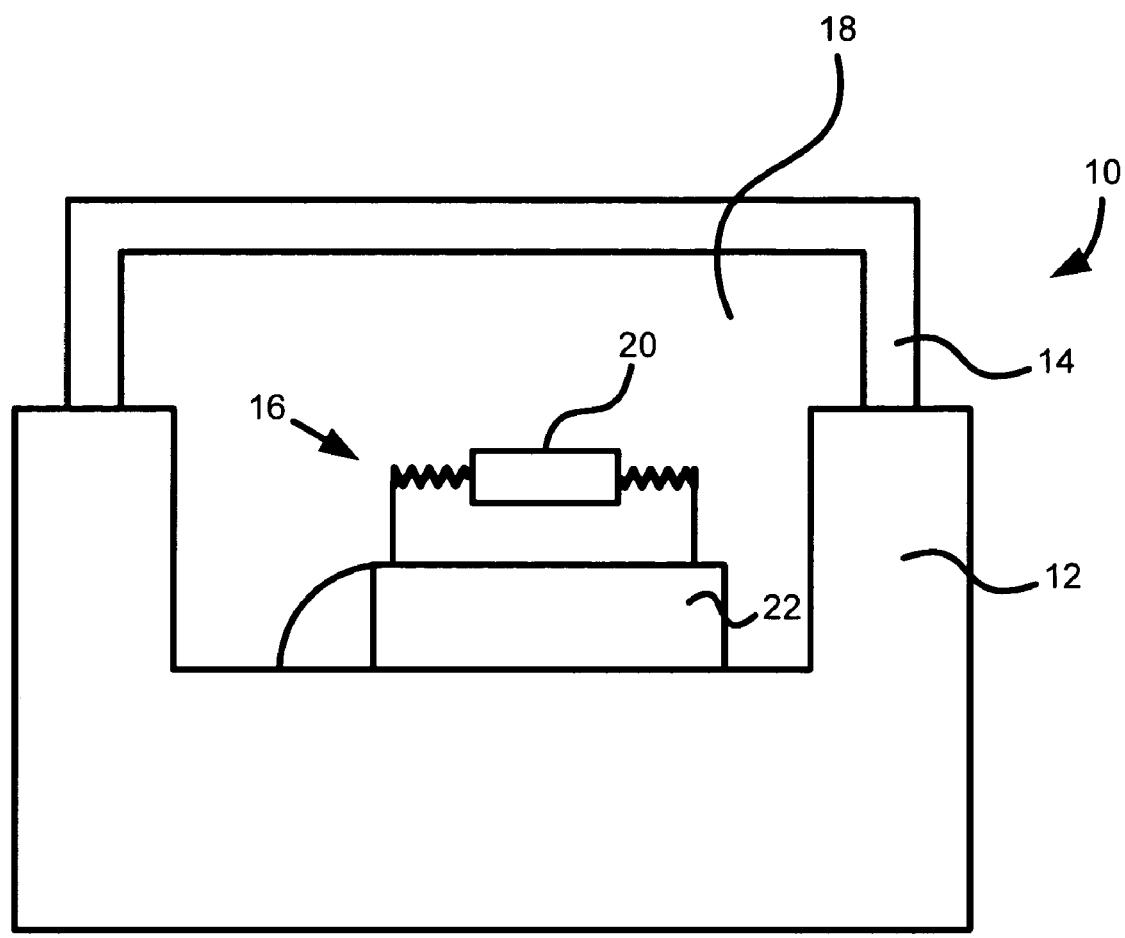
FIG. 2 schematically shows a cross-sectional view of the sensor shown in FIG. 1 along line 2—2.

FIG. 1 schematically shows a sensor 10 that may implement illustrative embodiments of the invention. FIG. 2 schematically shows a cross-sectional view of the same sensor 10 along line 2—2. More specifically, as shown in FIG. 1, the sensor 10 has a package 12 and a lid 14. In illustrative embodiments, the lid 14 hermetically seals the interior of the package 12, which contains an inertial device 16 (FIG. 2). The package 12 may be any conventional package that is capable of being hermetically sealed, such as a conventional ceramic cavity package.

As shown in FIG. 2, the package 12 and lid 14 together form a hermetically sealed chamber 18 for containing the noted inertial device 16. The inertial device 16 illustratively is a MEMS device having a movable mass 20 suspended above a die 22. In addition, the chamber 18 also contains a fill gas for cushioning the inertial device 16. In illustrative embodiments, the inertial device 16 has the functionality of an inertial sensor, such as a gyroscope or accelerometer. Of course, other embodiments may be used with other types of devices, such as MEMS pressure sensors. In fact, some embodiments may be used with non-MEMS devices or general integrated circuits. Accordingly, discussion of inertial sensors, such as MEMS accelerometers and gyroscopes, is exemplary and not intended to limit the scope of various embodiments.

When implemented as an accelerometer, the inertial device 16 has a normally stable (but movable) mass 20 suspended above the die 22, and circuitry (not shown) for detecting mass movement. The die 22 also may have standard transmit circuitry (also not shown) for forwarding information relating to detected mass movement to an external device. Alternatively, the transmit circuitry may be distributed across multiple die. Illustrative embodiments integrate the accelerometer functionality (structure and circuitry) on a single die. Exemplary MEMS accelerometers include those distributed and patented by Analog Devices, Inc. of Norwood, Mass. Among others, see U.S. Pat. No. 5,939,633, the disclosure of which is incorporated herein, in its entirety, by reference.

When implemented as a gyroscope, the inertial device 16 has an oscillating mass 20 suspended above the die 22, and circuitry (not shown) for actuating and detecting mass movement. In a manner similar to the above noted accelerometers, the die 22 also may have standard transmit circuitry (also not shown) for forwarding information relating to certain mass movement to an external device. Illustrative embodiments integrate the gyroscope functionality (structure and circuitry) on a single die. Exemplary MEMS gyroscopes include those distributed and patented by Analog Devices, Inc. of Norwood, Mass. Among others, see U.S. Pat. No. 6,505,511, the disclosure of which is incorporated herein, in its entirety, by reference.

Rather than being directly mounted to the inner surface (often referred to as a "die attach pad" or "paddle"), the die 22 may be coupled with a silicon insulator that itself is attached to the paddle. See, for example, U.S. patent application Ser. No. 10/234,215, naming Kieran Harney and Lewis Long as inventors, the disclosure of which is incorporated herein, in its entirety, by reference.

As noted above, the interior chamber 18 hermetically contains a fill gas for cushioning the MEMS device. A number of factors should be taken into consideration when determining an appropriate gas. Primarily, as noted above, the viscosity should be low enough to sufficiently reduce noise while maintaining its cushioning function. Because viscosity varies as a function of temperature and, to some extent, pressure, these viscosities are at expected operating temperatures and pressures.

Nitrogen, used by prior art packaged devices, has a viscosity of about 17.6 micropascal-seconds at about twenty degrees C. and expected pressures (greater than about 0.1 atmospheres). Although it may provide sufficient cushioning, it undesirably produces relatively high noise. For example, MEMS devices similar to that shown in FIG. 1 using nitrogen as a fill gas have produced noise of about 0.05 degrees per square root of a second.

Other gasses, however, should provide satisfactory cushioning while reducing noise. Selection of such other gasses, however, depends upon a number of factors other than viscosity. Specifically, in addition to having a lower viscosity, the following desirable qualities also should be taken into consideration when selecting a fill gas:

Low toxicity,
Low flammability,
Low cost,
Low corrosion potential,
Low boiling point (i.e., will not liquefy too easily),
Containability (i.e., the gas molecules are large enough to not escape the hermetic chamber 18 produced by the package 12 and lid 14, and
Effectiveness in the basic cushioning effect.

A number of gasses appear to meet various combinations of these criteria. Various hydrocarbons and fluorocarbons should provide the desired results. Propane, for example, has a viscosity of about 8 micropascal-seconds at about 20 degrees C., while also having low toxicity, low cost, low corrosion potential, and low boiling point. Moreover, propane also has good containability and is effective in its basic cushioning effect. Undesirably, however, propane is highly flammable. Despite its flammability, however, propane should provide satisfactory results when appropriately used.

Use of propane should reduce the error in the noted inertial device 16 to the range of about 0.02 degrees per square root of a second.

It should be noted that fluorocarbon gases, in this context, include hydrofluorocarbons ("HFC"). Examples of low viscosity hydrofluorocarbons gases include methyl fluoride ("HFC 41") and fluoroethane ("HFC 161").

Other lower viscosity gasses (relative to nitrogen) that also should provide satisfactory results include ethane, ethylene, ammonia, methane, hydrogen, Freon 22, isobutene, and n-butane. Each of these gasses have varying qualities that make them more or less desirable. One skilled in the art can select the appropriate gas based upon the criteria noted above. A range of viscosities between about 7 and 17.6 micropascal-seconds (at expected operating conditions) thus should reduce the noise below levels provided by nitrogen. It is anticipated that in some implementations, gasses having a viscosity of about one third the viscosity of nitrogen (under like conditions) should provide satisfactory results.

Some gasses may require a lower pressure to maintain one of the desired qualities, such as a low boiling point. For example, ammonia may require a pressure under half an atmosphere to remain gaseous at about −55 degrees C. Embodiments using ammonia thus may be formed to maintain a lower pressure within the chamber 18. For example, if the normal seal soldering temperature of the lid 14 is about 325 degrees C., then at about −55 degrees C., a package 12 sealed at atmospheric pressure should have an internal pressure of about 0.36 atmospheres. Consequently, when using such a package 12, ammonia could be used as a fill gas without readily liquefying. A similar comment applies to butane.

Again, it should be noted that the listing of specific gasses and types of gasses is exemplary and not intended to limit various embodiments of the invention. For example, certain mixtures containing these gasses, or gasses not listed, may provide satisfactory results. Those skilled in the art can use the above criteria to select such additional gasses.

Expected operating conditions can vary depending upon the application. Operating conditions may include temperatures during manufacture, as well as during use. Moreover, in illustrative embodiments, the pressure within the internal chamber 18 is a non-zero pressure.

Figure 3:
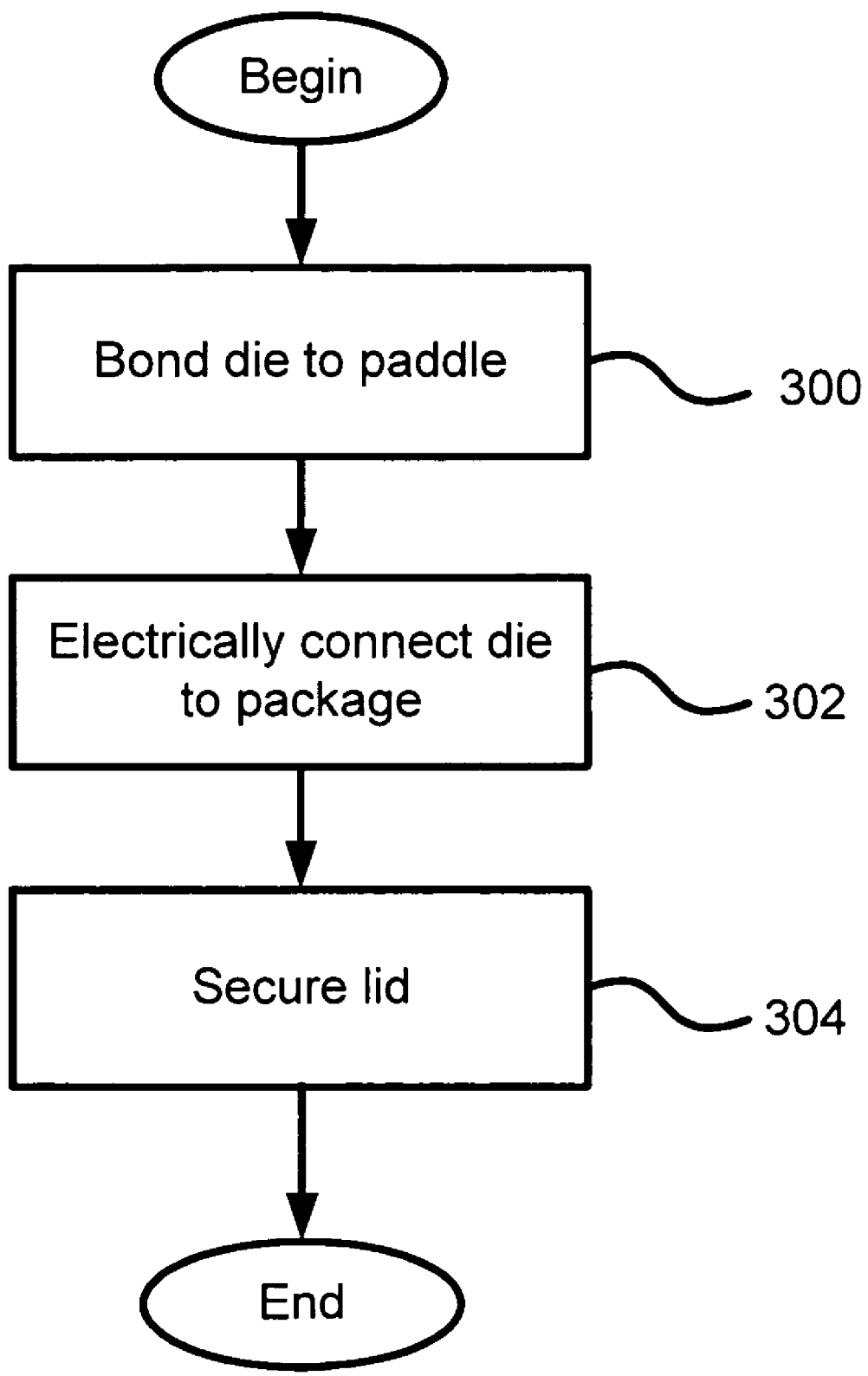
FIG. 3 schematically shows an exemplary process of producing the sensor shown in FIGS. 1 and 2.

The sensor 10 can be produced in accordance with conventional processes. FIG. 3 shows one exemplary process of forming the sensor 10 shown in FIGS. 1 and 2. The process begins at step 300, an adhesive bonds the die 22 to an interior surface of the package 12 (i.e., the die attach pad). The process then continues to step 302, in which the die 22 then is electrically interconnected to the package 12 (e.g., via soldering processes). Next, at step 306, the lid 14 is secured to the top of the package 12, thus hermetically sealing the interior chamber 18. Some of this process can be executed within a gas filled containing device having the fill gas, thus filling the internal chamber 18 with the desired fill gas. Alternatively, the fill gas may be added immediately before the lid 14 is secured to the package 12.

Those skilled in the art can use other processes for producing the sensor 10, as well as adding the fill gas. Accordingly, discussion of the process of FIG. 3 is exemplary and not intended to limit the scope of various embodiments.

Rather than use a package to seal the fill gas, some embodiments use a chip/die level gas cavity package (i.e., devices in which the chip/die itself forms at least part of the enclosure). Among other ways, such devices can have caps that are applied individually, applied at wafer-level, or formed in-situ as part of the wafer fabrication process. For example, see:

a. Capped die (including capped MEMS die): "Package for sealing an integrated circuit die", U.S. Pat. Nos. 6,323,550 and 6,621,158, b. Wafer level capping: "MEMS capping methods and apparatus", U.S. application publication 2003/0075794, and c. In-situ capped devices: "In-situ cap and method of fabricating same for an integrated circuit device", U.S. Pat. No. 6,465,280.

The disclosures of those patents and patent applications noted immediately above are incorporated herein, in their entireties, by reference.

Although the above discussion discloses various exemplary embodiments of the invention, it should be apparent that those skilled in the art can make various modifications that will achieve some of the advantages of the invention without departing from the true scope of the invention.

What is claimed is:

1. An inertial sensor comprising:
a housing forming an interior;
a movable component within the interior, the movable component being a part of a MEMS device; and
a fill gas within the interior,
the fill gas having a viscosity that is less than the viscosity of nitrogen under like conditions.

2. The apparatus as defined by claim 1 wherein the fill gas includes a fluorocarbon.

3. The apparatus as defined by claim 1 wherein the fill gas includes at least one of Freon 22, methane, ammonia, ethane, ethylene, hydrogen, butane, and propane.

4. The apparatus as defined by claim 1 wherein the movable component is a part of an accelerometer or a gyroscope.

5. The apparatus as defined by claim 1 wherein the fill gas has a viscosity that is no less than the viscosity of propane under like conditions.

6. The apparatus as defined by claim 1 wherein the housing includes a package and a cap, the cap hermetically sealing the package.

7. An inertial sensor comprising:
means for detecting movement;
means for containing the detecting means, the detecting means including a MEMS device; and
means for damping the detecting means, the damping means being within the containing means,
the damping means having a viscosity that is less than the viscosity of nitrogen under like conditions.

8. The inertial sensor as defined by claim 7 wherein the damping means has a viscosity that is no less than the viscosity of propane under like conditions.

9. The inertial sensor as defined by claim 7 wherein the damping means is a gas that includes at least one of a fluorocarbon, Freon 22, methane, ammonia, butane, ethane, hydrogen, and propane.

10. An apparatus comprising:
a package forming an interior with a substantially non-zero pressure;
a device within the interior, the device including a MEMS device; and
a fill gas within the interior,
the fill gas having a viscosity that is less than 17.6 micropascal-seconds at about 20 degrees C.

11. The apparatus as defined by claim 10 wherein the fill gas includes a fluorocarbon.

12. The apparatus as defined by claim 10 wherein the fill gas includes at least one of a fluorocarbon, Freon 22, methane, ammonia, ethane, hydrogen, butane, and propane.

13. The apparatus as defined by claim 10 wherein the device includes an accelerometer or a gyroscope.

14. The apparatus as defined by claim 10 wherein the fill gas has a viscosity between about 7 and 17 micropascal-seconds at about 20 degrees C.

15. The apparatus as defined by claim 10 wherein the package includes a cap, the cap hermetically sealing the package.

16. The apparatus as defined by claim 10 wherein the fill gas has a viscosity that causes the device to have a noise performance that is no greater than about 0.02 degrees per square root of a second.

17. The apparatus as defined by claim 10 wherein the package is a chip level package.

* * * * *